United States Patent
Wang et al.

(10) Patent No.: US 10,797,633 B2
(45) Date of Patent: Oct. 6, 2020

(54) THERMAL EMITTER FOR ENERGY CONVERSION TECHNICAL FIELD

(71) Applicant: Mitsubishi Electric Research Laboratories, Ind., Cambridge, MA (US)

(72) Inventors: Bingnan Wang, Belmont, MA (US); Chungwei Lin, Boston, MA (US); Jianjian Wang, Lancaster, PA (US); Koon Hoo Teo, Lancaster, MA (US)

(73) Assignee: Mitsubishi Electric Research Laboratories, Inc., Cambridge, MA (US)

( * ) Notice: Subject to any disclaimer, the term of this patent is extended or adjusted under 35 U.S.C. 154(b) by 419 days.

(21) Appl. No.: 15/347,961

(22) Filed: Nov. 10, 2016

(65) Prior Publication Data

US 2018/0131310 A1 May 10, 2018

(51) Int. Cl.
| | |
|---|---|
| *H02S 10/30* | (2014.01) |
| *H01L 37/02* | (2006.01) |
| *H99Z 99/00* | (2006.01) |
| *H01L 49/00* | (2006.01) |
| *H02S 40/20* | (2014.01) |

(52) U.S. Cl.
CPC .......... *H02S 10/30* (2014.12); *H01L 37/025* (2013.01); *H01L 49/00* (2013.01); *H02S 40/20* (2014.12); *H99Z 99/00* (2019.05)

(58) Field of Classification Search
CPC ...................................................... H02S 10/30
See application file for complete search history.

(56) References Cited

U.S. PATENT DOCUMENTS

| | | | |
|---|---|---|---|
| 6,271,461 B1 | 8/2001 | Fraas et al. | |
| 6,583,350 B1 | 6/2003 | Gee et al. | |
| 2008/0049328 A1* | 2/2008 | Zhou | G02F 1/292 359/566 |
| 2010/0294325 A1* | 11/2010 | Lee | G01J 3/108 136/206 |
| 2013/0342794 A1* | 12/2013 | Okada | G02B 5/3058 349/96 |
| 2014/0267979 A1* | 9/2014 | Mao | G02F 1/133536 349/62 |

(Continued)

FOREIGN PATENT DOCUMENTS

| | | | |
|---|---|---|---|
| JP | 2005242379 A | * | 9/2005 |
| WO | 2004079773 | | 9/2004 |
| WO | 2006086117 | | 8/2006 |

OTHER PUBLICATIONS

Penguin English Dictionary (trapezoid. (2007). In R. E. Allen (Ed.), The penguin English Dictionary (3rd ed.). London, UK: Penguin. Retrieved from https://search.credoreference.com/content/entry/penguineng/trapezoid/0?institutionId=743) (Year: 2007).*

(Continued)

*Primary Examiner* — Magali P Slawski
(74) *Attorney, Agent, or Firm* — Gennadiy Vinokur; James McAleenan; Hironori Tsukamoto

(57) ABSTRACT

A thermal emitter including a substrate and a grating arranged atop the substrate, the grating includes a plurality of equidistant structures having a cross-section with a trapezoid shape. Material of the substrate and the grating converts incoming heat into radiation.

12 Claims, 19 Drawing Sheets

(56) References Cited

U.S. PATENT DOCUMENTS

| | | | |
|---|---|---|---|
| 2015/0108508 A1* | 4/2015 | Wu | G02F 1/157 |
| | | | 257/84 |
| 2015/0228844 A1 | 8/2015 | Casse | |
| 2017/0156177 A1* | 6/2017 | Sugino | H05B 3/009 |

OTHER PUBLICATIONS

Partial translation of JP 2005242379 A, Tamada et al. (Year: 2018).*
Sai et al. "High-temperature resistive surface grating for spectral control of thermal radiation" Appl. Phys. Lett. 82, 1685 (2003); https://doi.org/10.1063/1.1560867 (Year: 2003).*

* cited by examiner

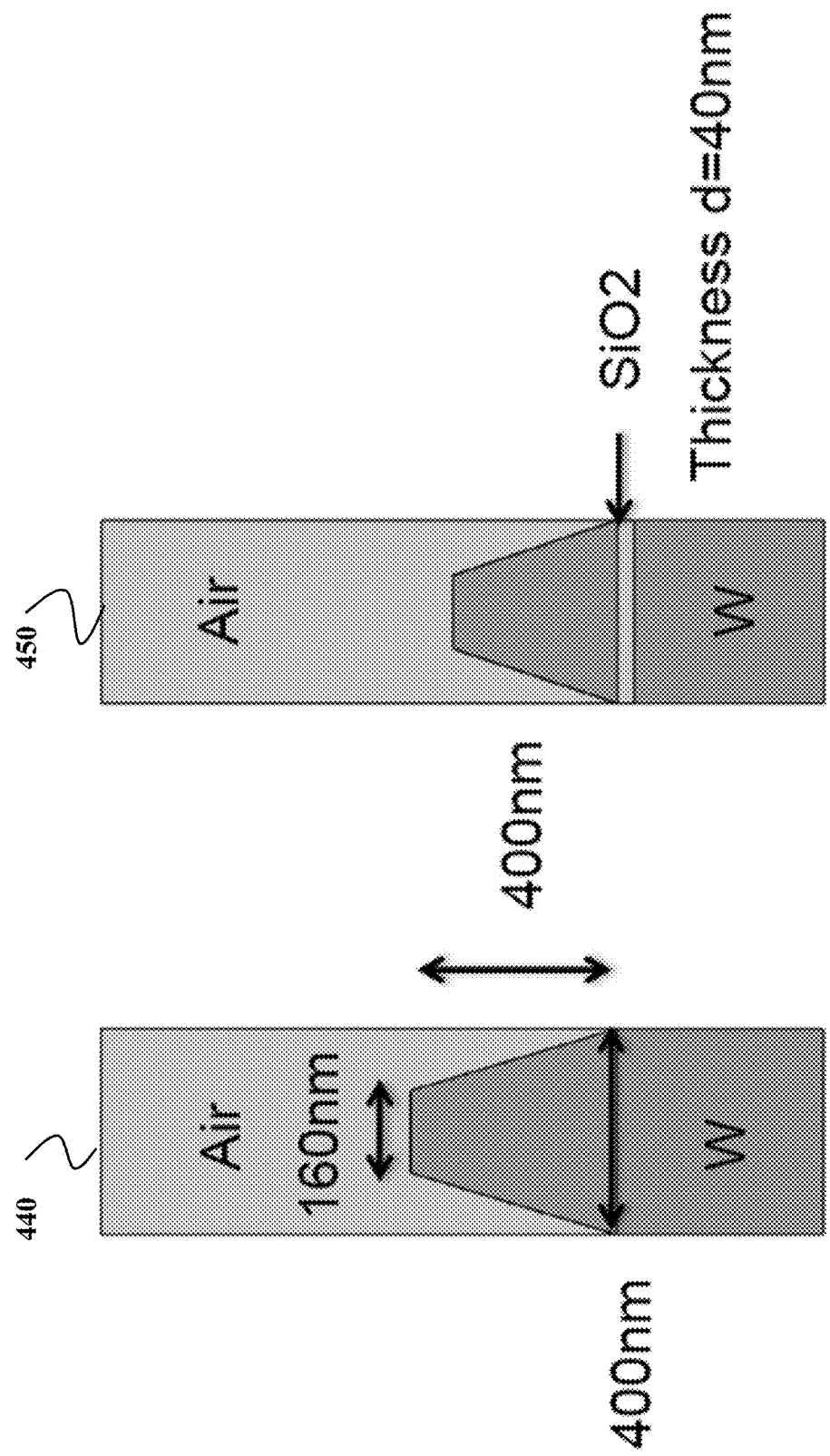

THERMAL EMITTER FOR ENERGY CONVERSION TECHNICAL FIELD

This invention relates to a thermal emitter device, and more specifically to a thermal emitter device suitable for energy conversion such as thermophotovoltaic (TPV) energy conversion.

BACKGROUND

Thermal emitters, which are devices to convert heat into radiation, are essential in many applications, including thermal imaging, sensing, and energy conversion in thermophotovoltaic (TPV) systems. The design of thermal emitters is actively pursued in order to offer more flexible control over the directional and spectral properties of thermal radiation, and to fit the needs of those applications.

For example, the thermal emitter is a key component of a TPV system, which converts heat into electric energy via photovoltaic cell. However, for an emitter without spectral control, significant amount of emission power is wasted. Various methods have been proposed to control the spectral selectivity of emitters with nanostructures. However, there is still a need for thermal emitters with thermal radiation spectrum suitable for thermophotovoltaic applications.

SUMMARY

It is an object of some embodiments to provide a thermal emitter suitable for energy conversion such as thermophotovoltaic (TPV) energy conversion. It is another object of some embodiments to provide such a thermal emitter that converts heat into radiation having spectrum tailored to the TPV applications.

Some embodiments are based on recognition that to improve the TPV efficiency, the thermal emitter has to emit photons with energy higher than energy of the bandgap of the photovoltaic cell as much as possible and to emit photons with energy lower than energy of the bandgap of the photovoltaic cell as little as possible. Alternatively speaking, it is desirable to have a selective emitter with high emittance at wavelengths shorter than $\lambda_g = hc/E_g$, and low emittance at wavelengths longer than $\lambda_g$, where h is the Planck constant, c is the speed of light, and $E_g$ is energy below the bandgap of the photovoltaic cell.

To that end, an optimal emittance curve of a thermal emitter tailored for TPV application follows a step function with a high emittance zone having spectrum that at least ideally equals to one for wavelength shorter than $\lambda_g$ and a low emittance zone having spectrum that at least ideally equals to zero for wavelength longer than $\lambda_g$. However, the thermal emitters with flat emitting surface usually fail to deliver such an optimal emittance pattern.

Some embodiments are based on recognition that a grating forming the emitting surface of the thermal emitter includes a plurality of equidistant structures that supports gap plasmon modes enabling high emittance. As used herein, surface plasmons (SPs) are coherent delocalized electron oscillations that exist at the interface between any two materials where the real part of the dielectric function changes sign across the interface (e.g. a metal-dielectric interface, such as a metal sheet in air). SPs have lower energy than bulk (or volume) plasmons which quantize the longitudinal electron oscillations about positive ion cores within the bulk of an electron gas (or plasma). The charge motion in a surface plasmon creates electromagnetic fields outside (as well as inside) the metal. The total excitation, including both the charge motion and associated electromagnetic field, is called either a surface plasmon polariton at a planar interface, or a localized surface plasmon for the closed surface of a small particle.

Some embodiments are based on realization that geometric parameters of the grating can be selected such that the grating creates two resonant modes within the high emittance zone of the emittance curve. Because the emittance is strongly peaked at the resonant energies, such a selection results in the enhanced emittance around the resonant energies.

However, some embodiments are based on recognition that the modes created with a typical profile of the grating structures, e.g., a rectangular profile, creates two well define resonant modes of excitation that can approach the optimal emittance curve but have a drop of excitation in a gap between the modes. To that end, some embodiments use the grating that includes a plurality of equidistant structures having a cross-section with a trapezoid shape. The grating with trapezoid structure supports localized surface plasmon modes in the gaps. Compared with the rectangular structure, the resonant modes are less well defined in frequency spectrum for the trapezoid design. As a result, the emittance drop is smaller between resonant modes, and emittance spectrum is smoother.

Additionally, or alternatively, some embodiments add dielectric layer arranged between the grating and the substrate of the thermal emitter. The dielectric layer supports additional resonant mode of excitation thereby increasing the bandwidth of the high emittance zone of the emitted spectrum.

Additionally, or alternatively, in some embodiments, the width of the bottom side of the trapezoid structures of the grating equals to the periodicity of the grating, e.g., the groves of the grating have triangular shape, i.e., walls of the grooves are touching with each other. In such a manner, the resonant mode in the dielectric layer is coupled with the localized surface plasmon mode supported by the top grating layer. The coupling effect shifts the resonant frequency toward desirable short wavelength. This coupled mode helps to further increase the bandwidth of high emittance and creates higher power conversion efficiency in the TPV system.

Also, other than the spectral selectivity, the emitter needs to operate at high temperature. To that end, some embodiments use refractory metals, such as tungsten, as emitter materials.

Accordingly, one embodiment discloses a thermal emitter including a substrate; and a grating arranged atop the substrate, the grating includes a plurality of equidistant structures having a cross-section with a trapezoid shape. Material of the substrate and the grating converts incoming heat into radiation. Optionally, the emitter can include a dielectric layer arranged between the grating and the substrate.

Another embodiment discloses a method for manufacturing a thermal emitter for forming a thermophotovoltaic (TPV) system including the thermal emitter and a photovoltaic cell. The method includes selecting a material of the thermal emitter; selecting geometrical parameters of a trapezoid shape based on a function of a bandgap of the photovoltaic cell, wherein the geometrical parameters and the material of the thermal emitter are selected to emit the radiation having wavelengths shorter than λg determined according to $\lambda_g = hc/E_g$, where h is the Planck constant, c is the speed of light, and $E_g$ is bandgap energy of the photovoltaic cell; and manufacturing the thermal emitter having a substrate and a grating including a plurality of equidistant structures with the shape having a non-rectangular cross-section forming the trapezoid shape with the geometrical parameters.

BRIEF DESCRIPTION OF THE DRAWINGS

FIG. 4B and FIG. 4C are examples of different geometrical parameters used by some embodiments;

DETAILED DESCRIPTION

Thermophotovoltaic (TPV) energy conversion involves the conversion of heat to electricity, and has been identified as a promising technology since the 1960's. A basic TPV system includes a thermal emitter and a photovoltaic diode receiver. The thermal emitter is typically a piece of solid material or a specially engineered structure that generates thermal emission when heated to a high temperature (i.e., typically in a range from about 1200° K to about 1500° K). Thermal emission is the spontaneous radiation (emission) of photons due to thermal motion of charges in the thermal emitter material. For normal TPV system operating temperatures, the radiated photons are mostly at near infrared and infrared frequencies. The photovoltaic diode receiver includes a photovoltaic (PV) cell positioned to absorb some of these radiated photons, and is constructed to convert the absorbed photons into free charge carriers (i.e., electricity) in the manner typically associated with conventional solar cells. The thermal emitter is solid structure that is heated from an external source (e.g., by concentrated sunlight or other heat generator).

Figure 1A:
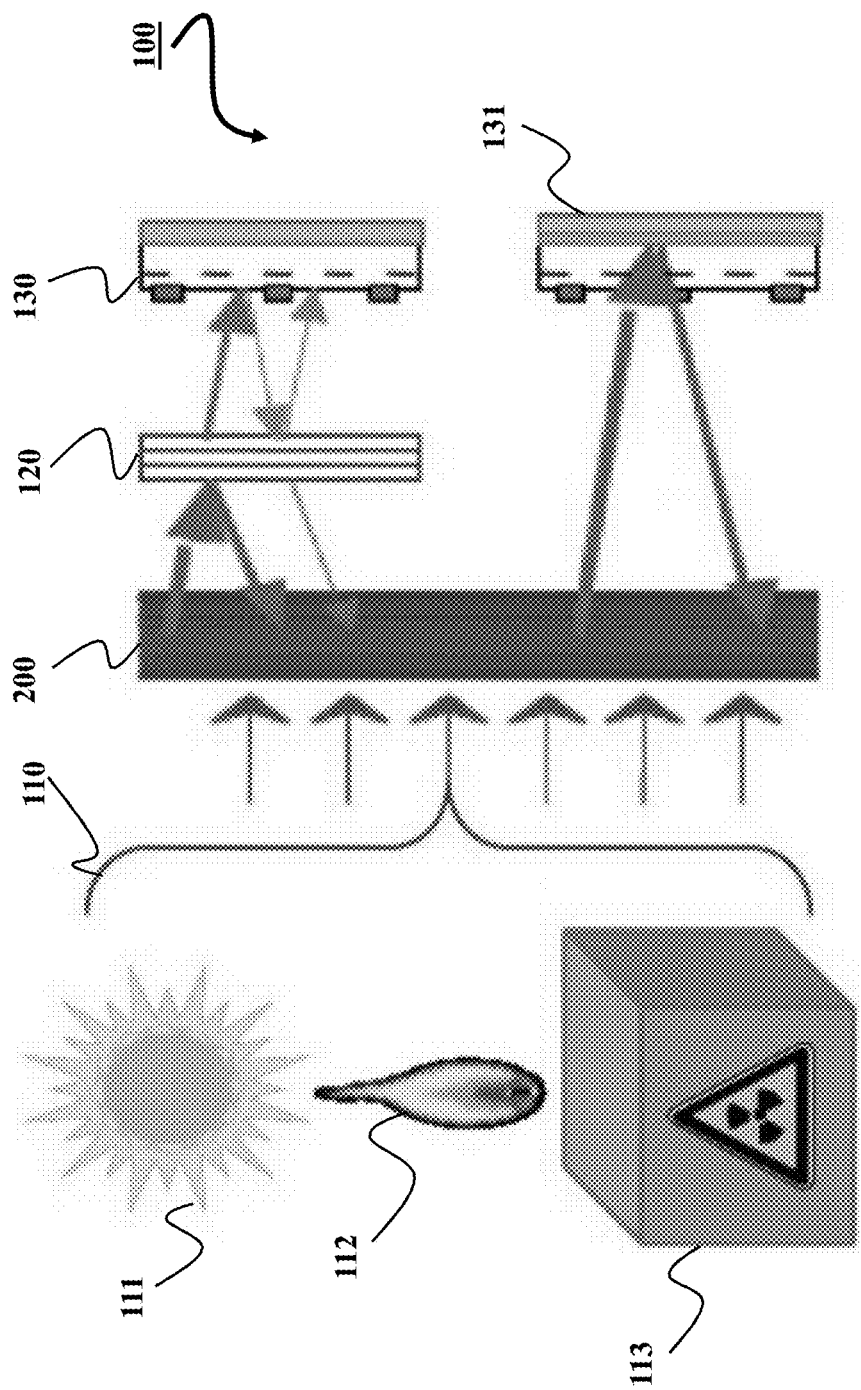
FIG. 1A is an example of a thermophotovoltaic (TPV) system according to one embodiment.

FIG. 1A shows an example of a TPV system 100 according to one embodiment. The TPV system 100 includes a source of heat 110, a thermal emitter 200 for converting the heat from the heat source 110 into radiation, and a photovoltaic cell 130 and/or 131 for converting the radiation into electricity. Examples of the heat source 110 include radiation from sun 111, as well as combustion 112, nuclear 113 and other energy sources.

The operation of TPV is based on photovoltaic (PV) principle, but the direct radiation energy comes from a high temperature (1000-2000K) emitter. To that end, some embodiments use refractory metals, such as tungsten, as emitter materials. For example, in PV system, the solar cell directly receives radiation energy from the sun. Distance between the emitter and TPV cell is ~μm to cm, while in PV system, the solar cell is millions of miles away from the sun. To that end, the radiation intensity from the emitter in TPV is much higher than that from the sun in PV system due the close distance between the emitter and TPV cell, although the emitter temperature is much lower than the sun temperature. Also, the PV system can only use part of solar radiation, where only photons with energy higher than the bandgap of the solar cell can be converted into electron-hole pairs, other low energy photons are useless. However, with a proper spectral control system in TPV, photons with energy below semiconductor band gap can be reflected back to the emitter to recycle. To that end, with the proper the spectral control, potential efficiency of TPV system is much higher than PV system.

In particular, the thermal emitter is a key component on a TPV system, which converts heat into electric energy via photovoltaic cell. If a TPV emitter is an ideal blackbody emitter, significant amount of emission power is wasted, since photons with energy below the bandgap of the PV cell ($E_g$ with corresponding wavelength $\lambda_g = hc/E_g$, where h is Planck's constant, c is the speed of light.) cannot generate electron-hole pairs. Accordingly, in some embodiments, the thermal emitter 200 is designed to emit photons with energy higher than PV cell bandgap as much as possible, and to emit photons with energy lower than PV cell bandgap as little as possible. Optionally, the system 100 can use other spectral control options to increase the TPV system efficiency. For example, in one implementation, the system 100 uses a band-pass filter and/or a reflector 120 that only allows useful photons pass through and/or reflects useless photons back to the emitter to recycle them.

Figure 1B:
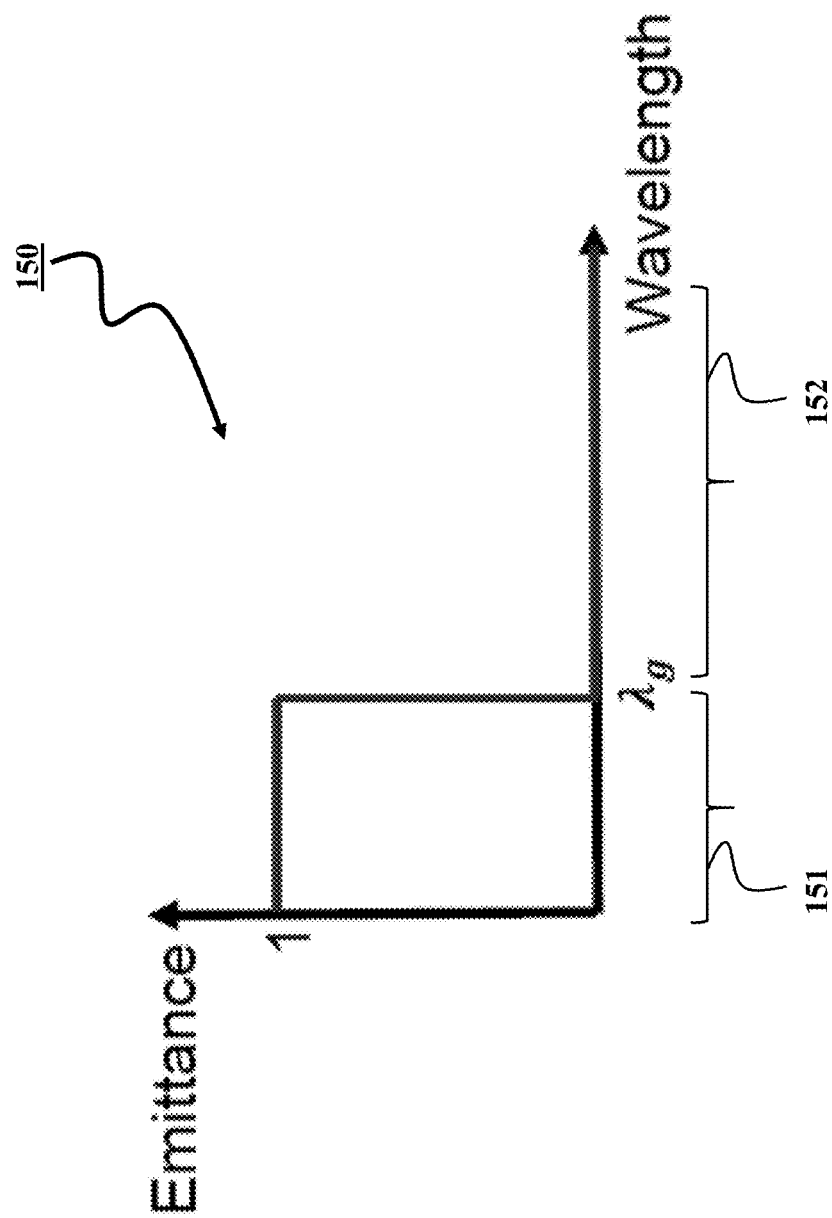
FIG. 1B is a plot of an optimal emittance curve of a thermal emitter tailored for TPV application.

FIG. 1B shows a plot of an optimal emittance curve 150 of a thermal emitter tailored for TPV application. The optimal emittance curve 150 follows a step function with a high emittance zone 151 having spectrum that at least ideally equals to one for wavelength shorter than $\lambda_g$ and a low emittance zone 152 having spectrum that at least ideally equals to zero for wavelength longer than $\lambda_g$. However, the thermal emitters with flat emitting surface usually fail to deliver such an optimal emittance pattern.

Figure 2A:
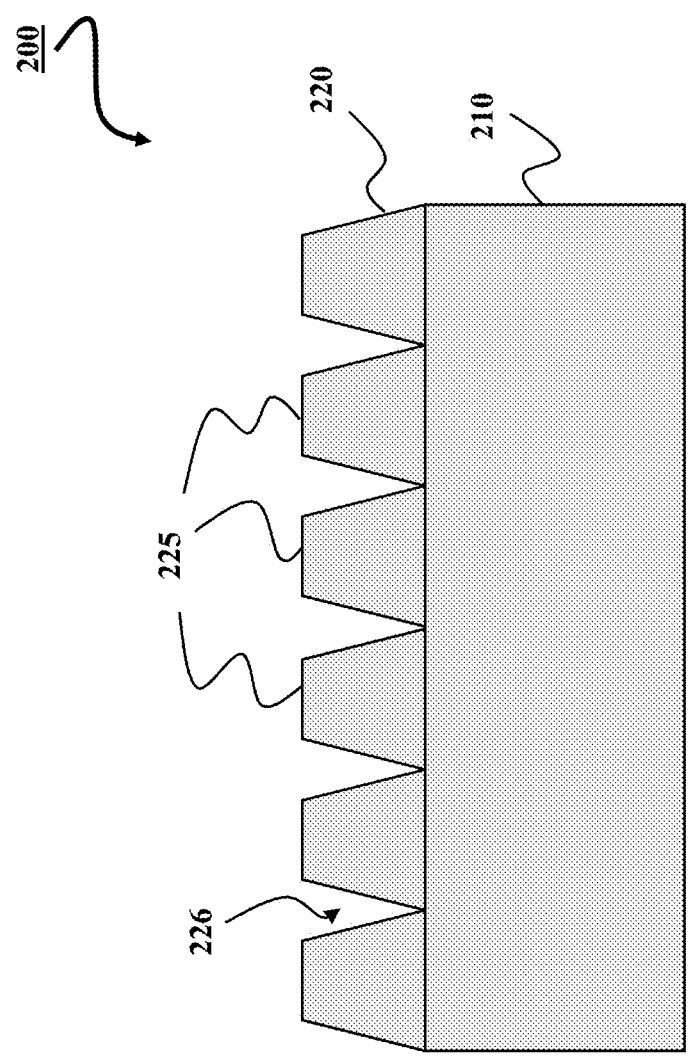
FIG. 2A is a cross-section of a thermal emitter according to one embodiment.

FIG. 2A shows a cross-section of a thermal emitter 200 according to one embodiment. The thermal emitter 200 includes a substrate 210 and a grating 200 arranged atop the substrate. The grating 200 includes a plurality of equidistant structures 225 having a cross-section with a trapezoid shape. In this embodiment, the equidistant structures 225 in the grating 220 are separated by grooves 226 of triangular profile.

The material of the substrate and the grating converts incoming heat into radiation and typically use refractory metals, such as tungsten. For example, the thermal emitter 200 can form a part of the TPV system 100 of FIG. 1A, in which the grating form the emitting surface oriented toward the photovoltaic cell 130 and/or 131.

Some embodiments are based on recognition that a grating forming the emitting surface of the thermal emitter includes a plurality of equidistant structures that supports gap plasmon modes enabling high emittance. As used herein, surface plasmons (SPs) are coherent delocalized electron oscillations that exist at the interface between any two materials where the real part of the dielectric function changes signs across the interface (e.g. a metal-dielectric interface, such as a metal sheet in air). SPs have lower energy than bulk (or volume) plasmons which quantize the longitudinal electron oscillations about positive ion cores within the bulk of an electron gas (or plasma). The charge motion in a surface plasmon creates electromagnetic fields outside (as well as inside) the metal. The total excitation, including both the charge motion and associated electromagnetic field, is called either a surface plasmon polariton at a planar interface, or a localized surface plasmon for the closed surface of a small particle.

Figure 2B:
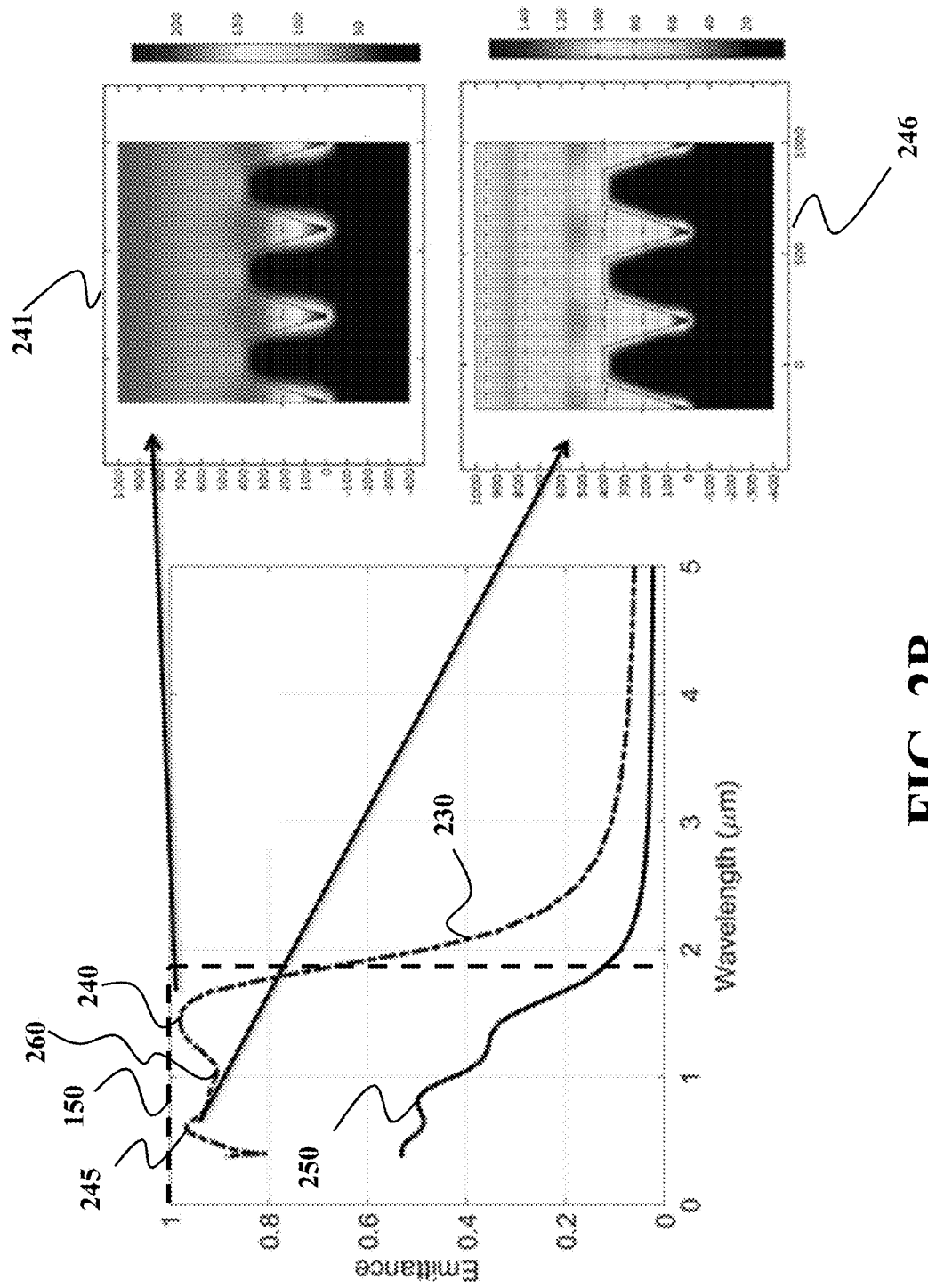
FIG. 2B is a plot of an emittance curve of a thermal emitter tailored for TPV application according to some embodiments.

FIG. 2B shows a plot of an emittance curve 230 of a thermal emitter tailored for TPV application according to some embodiments. Due to the resonant modes 240 and 245 produce by the grating 220, the emittance curve 230 resamples the optimal emittance curve 150 much better that an emittance curve 250 of a flat thermal emitter, i.e., a thermal emitter with a flat emitting surface.

Some embodiments are based on recognition that grating can significantly enhance emission compared with flat tungsten surface owing to several physical mechanisms, including cavity resonances, propagating surface plasmon polaritons, and localized surface plasmon resonances (LSPRs). LSPRs can be excited at both vertical and horizontal metal-dielectric boundaries, and the resonant frequencies can be tuned via geometrical design. Moreover, the nanostructures to support LSPRs can be made to be subwavelength; therefore, more resonances can be excited within the same area, creating stronger absorption effect.

Additionally, some embodiments are based on recognition that the modes created with a typical profile of the grating structures, e.g., a rectangular profile, creates one or more well define resonant modes of excitation that can approach the optimal emittance curve but have a drop of excitation in a gap between the modes. To that end, some embodiments use the grating that includes a plurality of equidistant structures having a cross-section with a trapezoid shape. The grating with trapezoid structure supports localized surface plasmon modes in the gap 260 between the resonant modes 240 and 245. These modes are less well defined due to the gradually varying width of the gap, therefore the emittance drop between resonances is not significant. As a result, over 0.9 emittance is obtained between 0.5 and 1.7 um. Compared with the rectangular structure, the resonant modes are less well defined in frequency spectrum 241 and 246 for the trapezoid design. As a result, the emittance drop is smaller between resonant modes, and emittance spectrum is smoother.

Figure 3A:
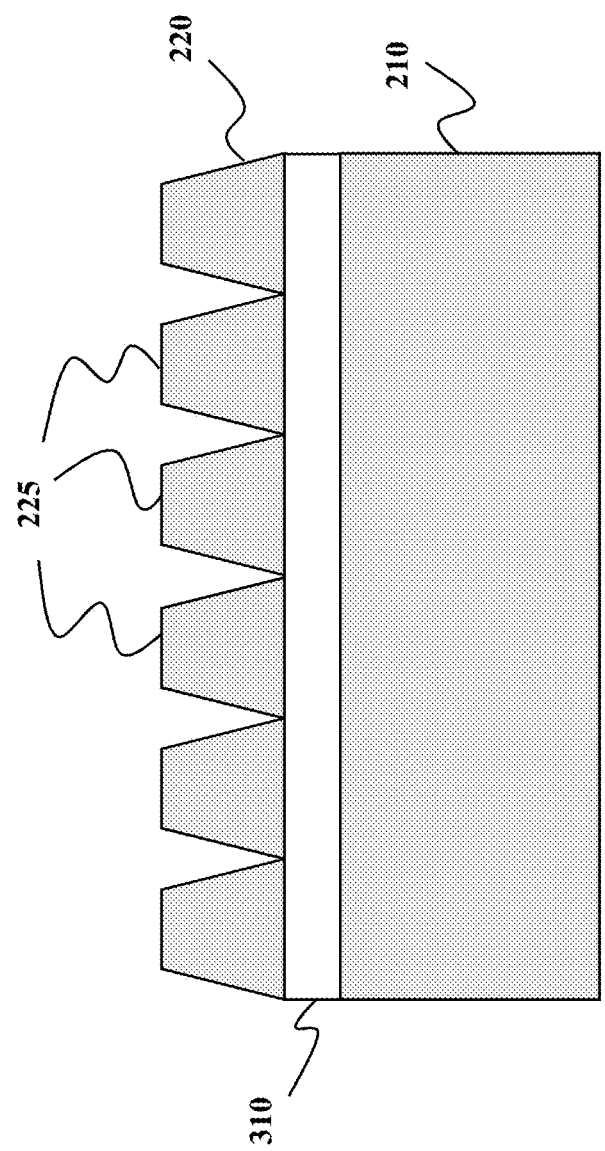
FIG. 3A is a cross-section of a thermal emitter according another embodiment that includes a dielectric layer.

FIG. 3A shows a cross-section of a thermal emitter according another embodiment that includes a dielectric layer 310 arranged between the grating 220 and the substrate 210 of the thermal emitter. For example, the dielectric layer 310 can include SiO2 (silicon dioxide). The dielectric layer 310 supports additional resonant mode of excitation thereby increasing the length of the high emittance zone of the emitted spectrum.

Figure 3B:
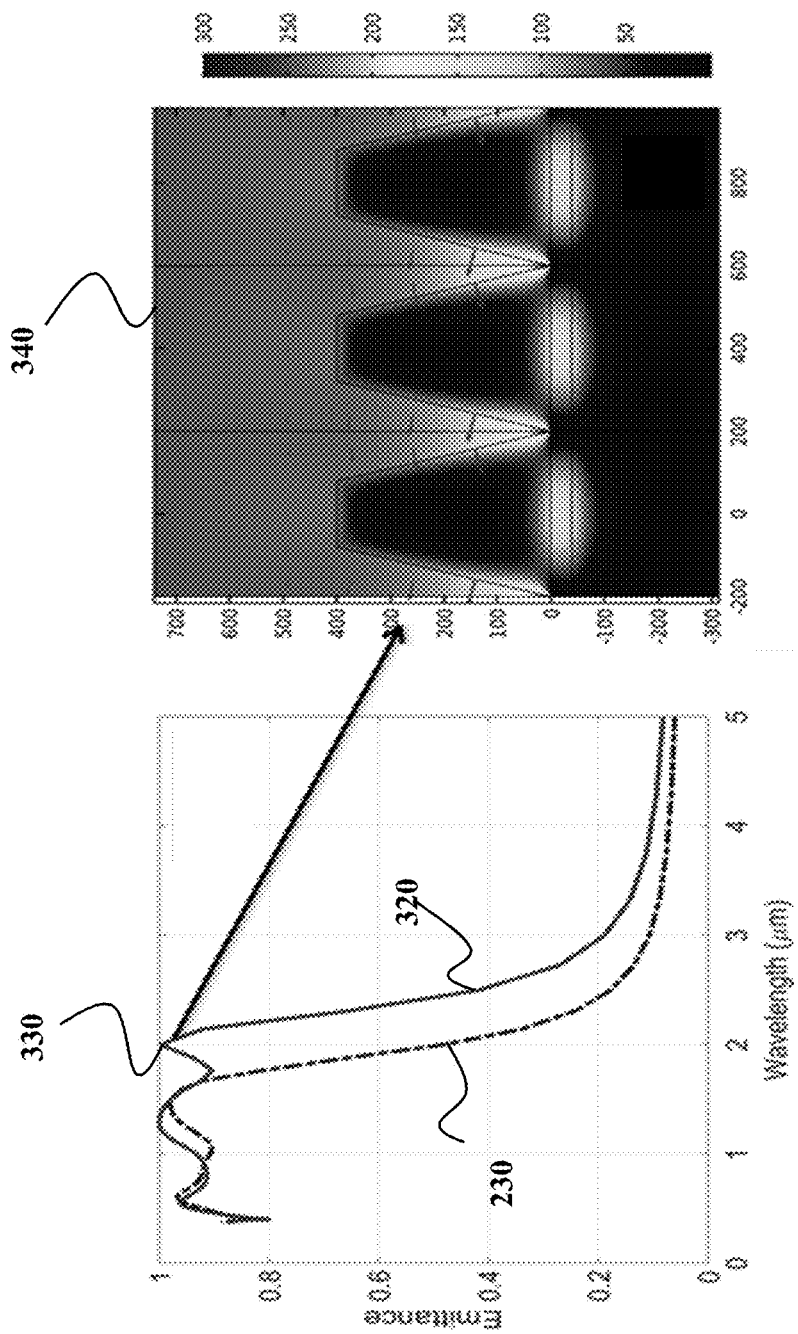
FIG. 3B is a plot of an emittance curve of a thermal emitter of FIG. 3A.

FIG. 3B shows a plot of an emittance curve 320 of a thermal emitter of FIG. 3A. With respect to the emittance curve 230 of the thermal emitter of FIG. 2A, the emittance curve 320 has an additional resonant mode 330 created due to the coupling of the dielectric layer 310, as shown of the frequency spectrum 340.

As shown in FIG. 3B, a three-layer structure, with a metallic top grating layer and a metallic substrate, sandwiched with a dielectric layer in between, can support LSPR modes too. Specifically, both LSPR modes in the top layer gap and the middle layer spacer can be excited. Light is coupled to the LSPR in the spacer through the mode in the gap. The extra resonant peak due to the LSPR in the spacer extends the bandwidth of high emittance. As shown in FIG. 3B, the lower bound of high emittance over 0.9 is extend to 2.2 um, which matches well to the bandgap of commonly used TPV cell of InGaSb. The strong field localization at the spectrum 340 at 2.0 μm around both gap and spacer indicates the aforementioned mode coupling between gap and spacer modes.

Figure 3C:
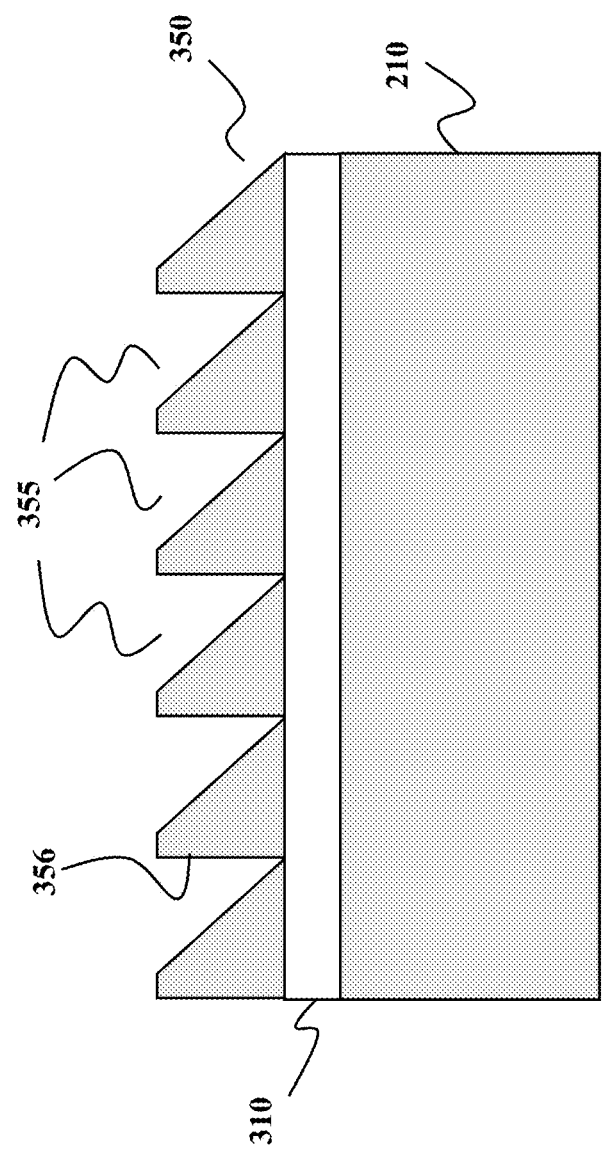
FIG. 3C is a cross-section of an exemplar thermal emitter with different shape of the trapezoidal structures forming the grating according to some embodiments.

FIG. 3C shows a cross-section of an exemplar thermal emitter with different shape of the trapezoidal structures 355 of the grating 350. In various embodiments, the trapezoidal shape of the structure of the grating can vary, e.g., based on the application and/or usage of the thermal emitter. In the example of FIG. 3C, the trapezoid shape forms a rectangular trapezoid 356, which can simplify manufacturing process.

For example, in some embodiments, e.g., the embodiments of FIG. 2A and FIG. 3A, the equidistant structures in the grating are separated by grooves of triangular profile, such that the width of the bottom side of the trapezoid shape of the structure of the grating equals to the periodicity of the grating. In such a manner, the coupling created by the gating structures is stronger. However, in different embodiments, the periodicity of the structure can vary.

Figure 3D:
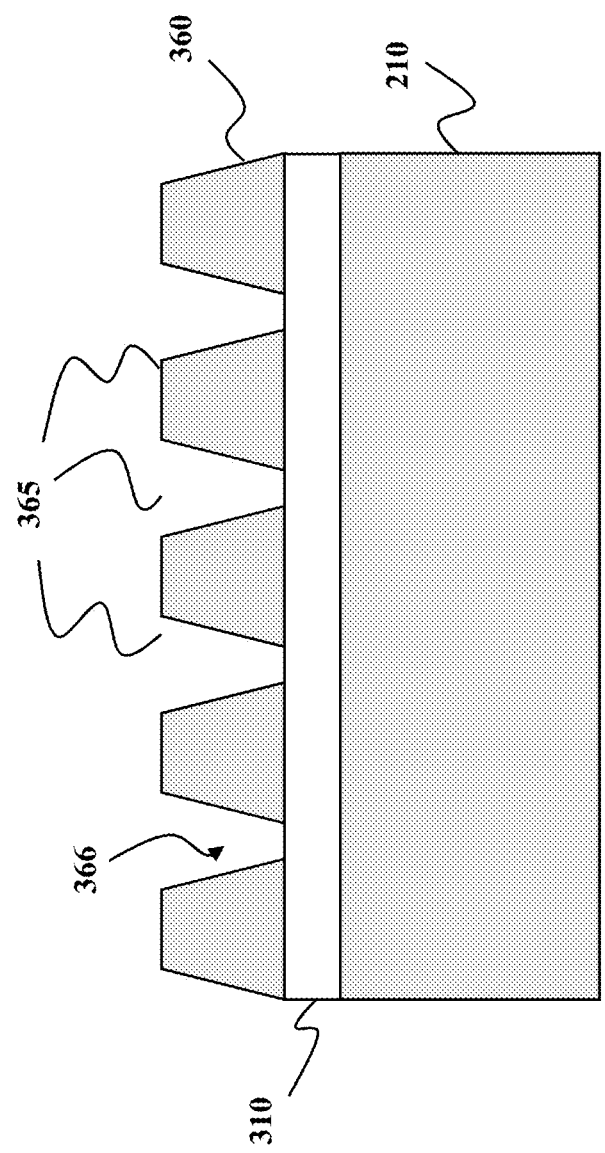
FIG. 3D is a cross-section of an exemplar thermal emitter with different periodicity of the trapezoidal structures of the grating according to one embodiment.

FIG. 3D shows a cross-section of an exemplar thermal emitter with different periodicity of the trapezoidal structures 365 of the grating 360 according to one embodiment. In this embodiment, the equidistant structures 365 in the grating are separated by grooves 366 of trapezoidal profile.

Additionally, or alternatively, different embodiments can vary parameters of the trapezoidal structures as well as periodicity of the trapezoidal structures. For example, some embodiments select geometric parameters of the structure to excite multiple gap plasmon modes. The geometric parameters can include one or combination of periodicity of the grating, height of the grating, and dimensions of the trapezoid shape.

Figure 4A:
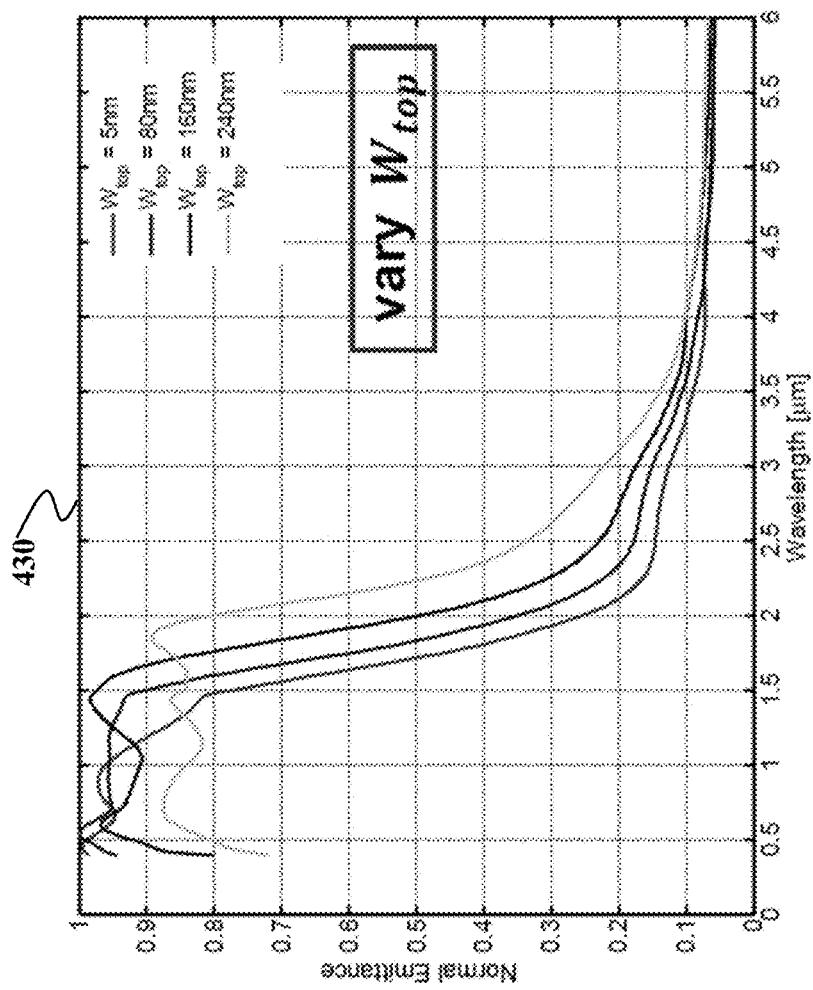
FIG. 4A is an example of some geometric parameters of the structure of the grating.
Figure 4A:
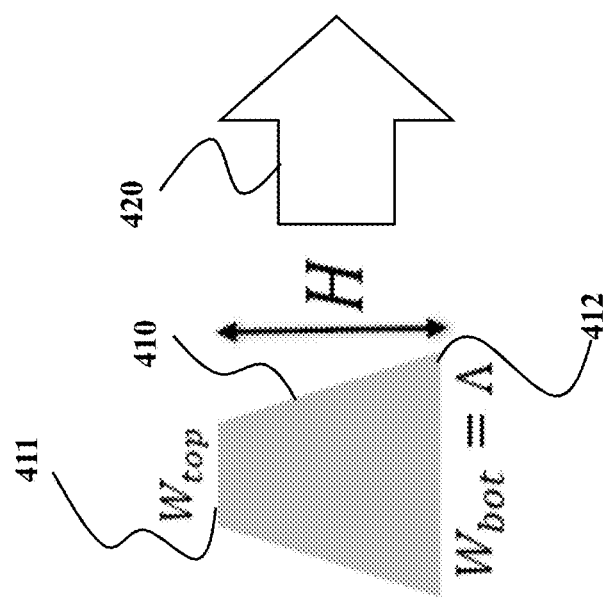

FIG. 4A shows an example of some geometric parameters of the structure 410 of the grating. The structure 410 has a trapezoid shape formed by two parallel sides including a bottom side 412 proximate to the substrate and an upper side 411 opposite to the bottom side. Typically, the width of the bottom side is greater than the width of the upper side. For example, some embodiments can vary 420 the width of the bottom and/or top sides of the trapezoid shape of the structure 410 to produce different emittance curve 430. For example, in one embodiment the width of the bottom side is at least ten times greater than the width of the top side. In alternative embodiment, the width of the bottom side is less that ten percent greater than the width of the top side.

FIG. 4B and FIG. 4C shows examples 440 and 450 of different geometrical parameters used by some embodiments. However, in various embodiments, the geometrical parameters and the material of the thermal emitter are selected to emit the radiation having wavelengths shorter than λg determined according to $\lambda_g = hc/E_g$, where h is the Planck constant, c is the speed of light, and $E_g$ is energy below the bandgap of the photovoltaic cell.

Figure 4D:
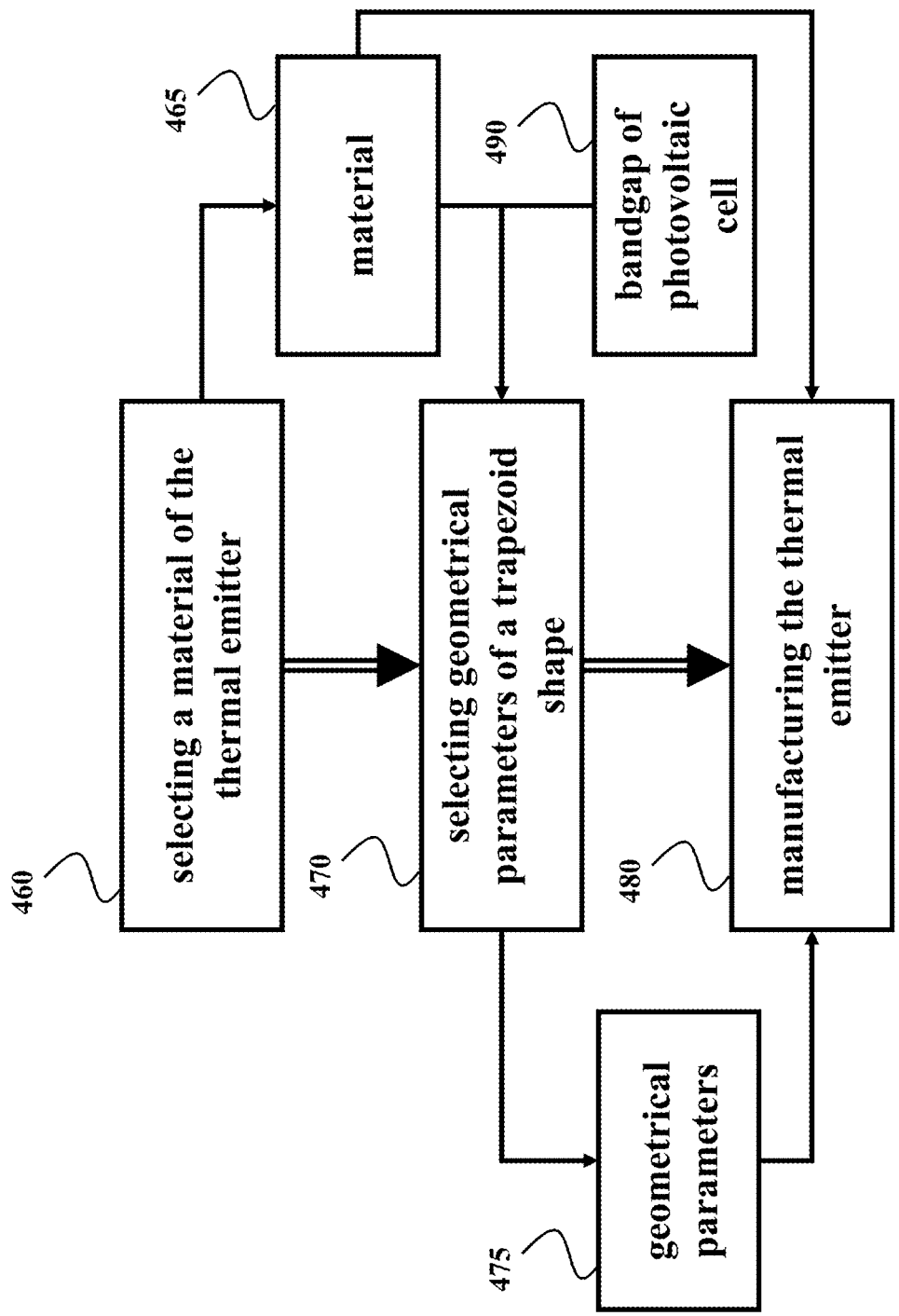
FIG. 4D is a block diagram of a method for manufacturing a thermal emitter for forming a TPV system including the thermal emitter and a photovoltaic cell according to one embodiment.

FIG. 4D shows a block diagram of a method for manufacturing a thermal emitter for forming a TPV system including the thermal emitter and a photovoltaic cell according to one embodiment. The method selects 460 a material 465 of the thermal emitter. An example of the material 465 includes tungsten due to its thermal resistance.

The method selects 470 geometrical parameters 475 of a trapezoid shape based on a function of a bandgap of the photovoltaic cell 490, such that the geometrical parameters and the material of the thermal emitter are selected to emit the radiation having wavelengths shorter than λg determined according to $\lambda_g = hc/E_g$, where h is the Planck constant, c is the speed of light, and $E_g$ is energy below the bandgap of the photovoltaic cell. Next, the thermal emitter is manufactured 480 using the material 465 to include a substrate and a grating including a plurality of equidistant structures with the shape having a non-rectangular cross-section forming the trapezoid shape with the geometrical parameters.

In different embodiments, the calculations of the method of FIG. 4D are performed using a processor. For example, the processor can be used for plotting the emittance curve and/or for the simulating the performance of the thermal emitter. The manufacturing 480 can be performed, e.g., by depositing the thin dielectric layer on top of substrate, and fabricating the grating layer first by depositing a thin film and then go through photolithography and etching steps to form the grating pattern.

Examples of Geometrical Parameters of the Grating Structures

Figure 5A:
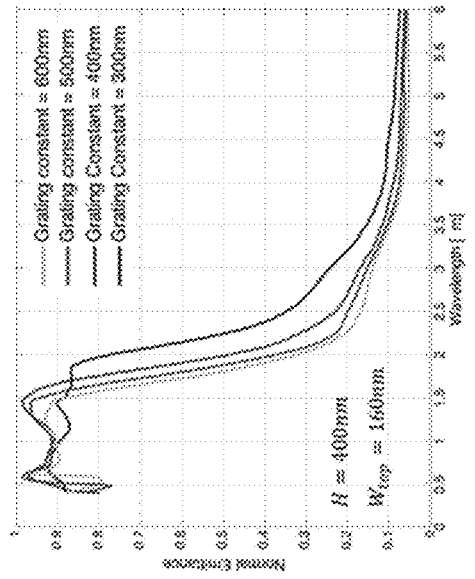
FIGS. 5A, 5B, 5C and 5D are examples of different emittance curves of the thermal emitter designed according to the principles of the thermal emitter of FIG. 2A.

FIGS. 5A, 5B, 5C and 5D are examples of different emittance curves of the thermal emitter designed according to the principles of the thermal emitter of FIG. 2A. FIG. 5A show different emittance curves for different top width of the grating structure. For example, some embodiments use top width around 5-240 nm to form the grating structure suitable for the TPV emitter. Compared with bilayer grating structure, the thermal emitter with the trapezoidal grating structures has much higher emittance in the wavelength range 0.5-1 um.

Figure 5B:
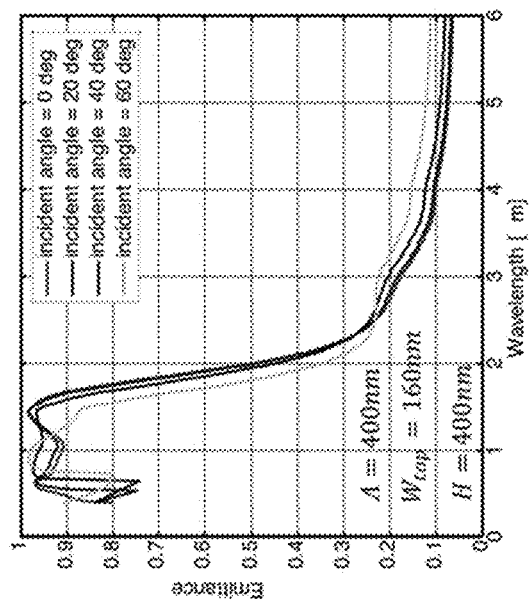

FIG. 5B shows the grating periodicity effect on the emittance performance. For grating constant (periodicity) around 300-600 nm, the grating structure is a good candidate as TPV emitter since the thermal emitter has very broadband high emittance between 0.4-1.7 um/2 um.

Figure 5C:
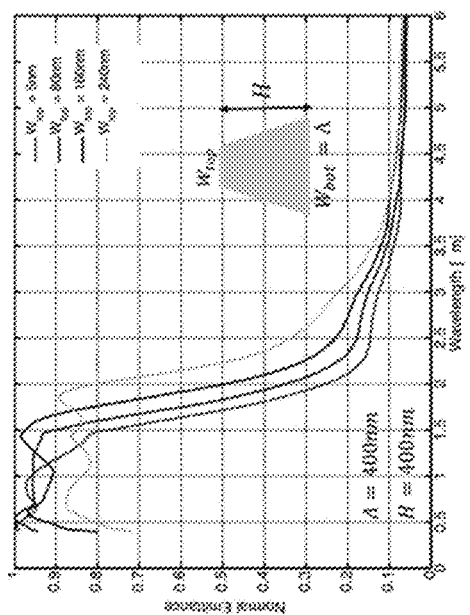

FIG. 5C shows the effect of varying grating height on the spectral normal emittance of the grating structure of the thermal emitter of FIG. 2A. As shown in FIG. 5C, the grating height around 300-500 nm is suitable for the TPV emitter. Grating structure with H=600 nm can also be used together with filter or reflector. Grating structure with H=200 nm (combined with filter) is more suitable for Si-based TPV system.

Figure 5D:
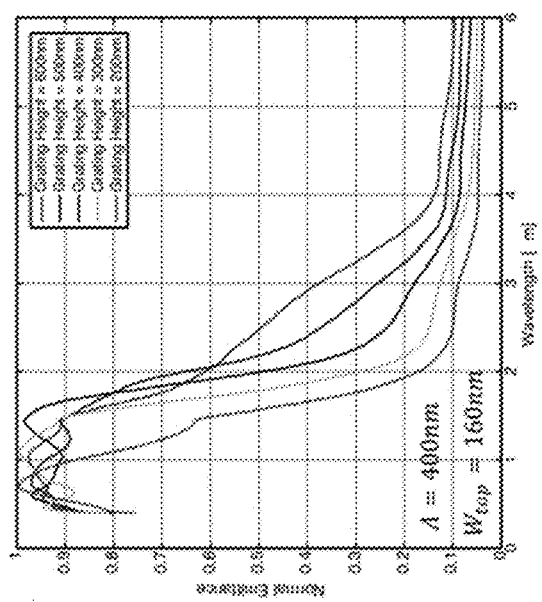

FIG. 5D shows the spectral emittance of grating structure of the thermal emitter of FIG. 2A at different incident angles. The emitter performance is still very good even when the incident angle increases to 60°, which is a desirable property for TPV emitter.

Figure 6A:
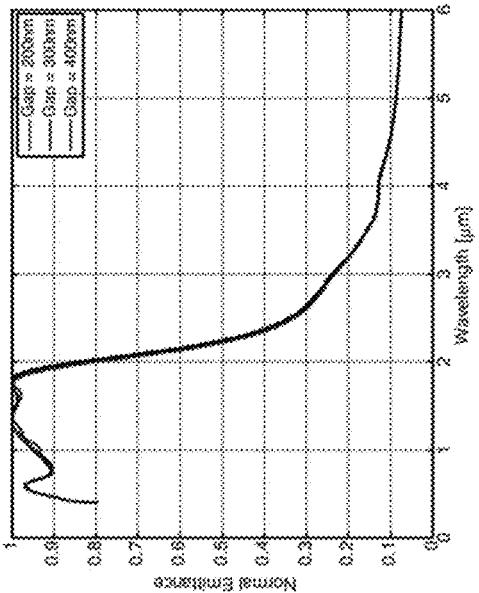
FIGS. 6A, 6B, 6C and 6D are examples of different emittance plots for emittance of the thermal emitter of FIG. 3A.
Figure 6B:
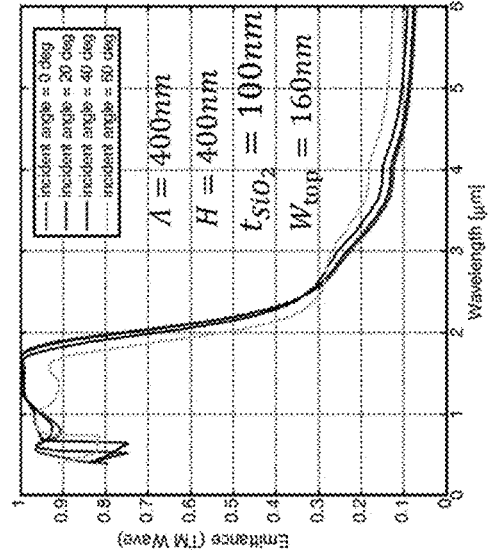

FIGS. 6A, 6B, 6C and 6D are examples of different emittance plots for emittance of the thermal emitter of FIG. 3A. FIGS. 6A and 6B show the effect of dielectric spacer thickness on the spectral normal emittance of grating structure of the thermal emitter of FIG. 3A. In those examples, the bottom width is kept as constant 400 nm (equals to the grating period). As can be seen at FIGS. 6A and 6B, with a SiO2 spacer between the grating and substrate, emittance performance is further improved. This thermal emitter has very high emittance (>0.9) in a very broadband wavelength range (0.5-2 um) for a wide range of spacer thickness (20-400 nm range simulated).

Figure 6C:
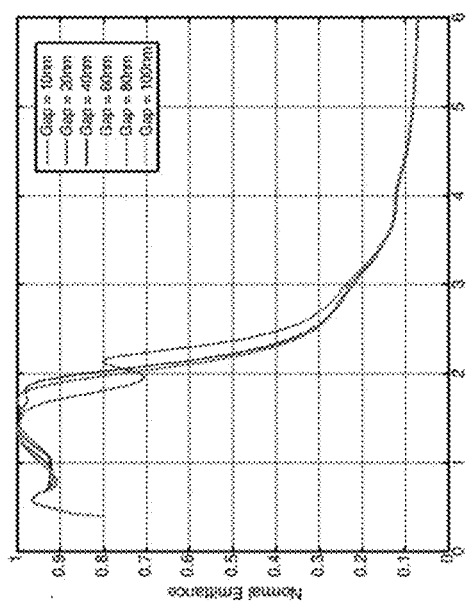
Figure 6D:
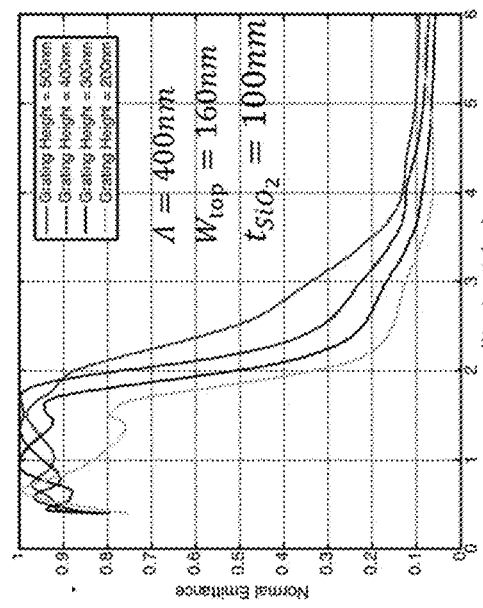

As shown on FIG. 6C, the grating height around 300-500 nm is suitable for TPV emitter, while H=500 is better to be used with filter or reflector due to the relative slower transition from high emittance to low emittance. FIG. 6D shows the spectral emittance of grating the thermal emitter of FIG. 3A at different incident angles. The emitter performance is still acceptable even when the incident angle increases to 60°.

Figure 7A:
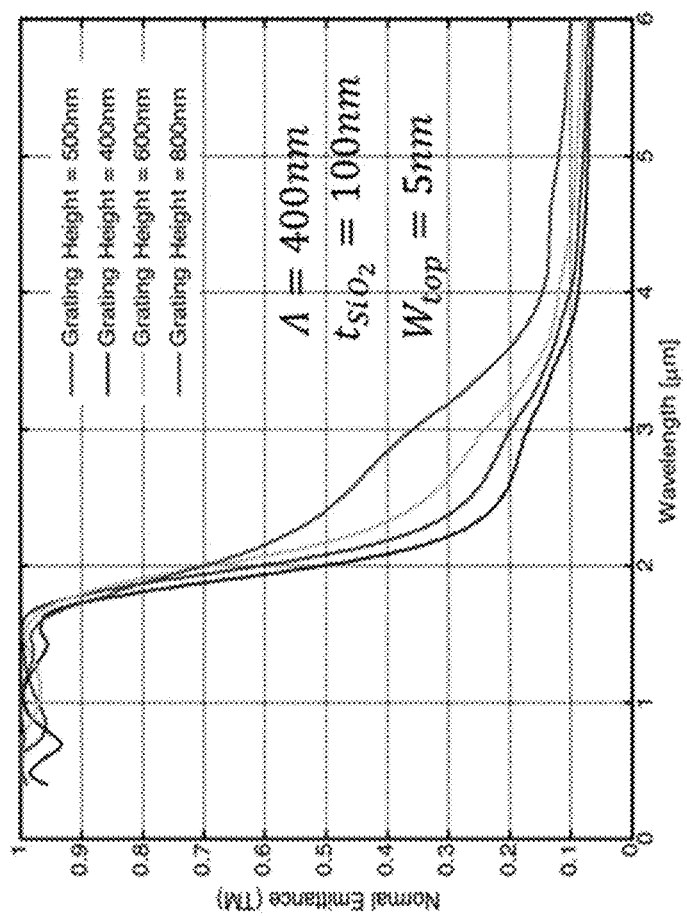
FIGS. 7A, 7B, and 7C are examples of different emittance plots for emittance of the thermal emitter of FIG. 3C.
Figure 7B:
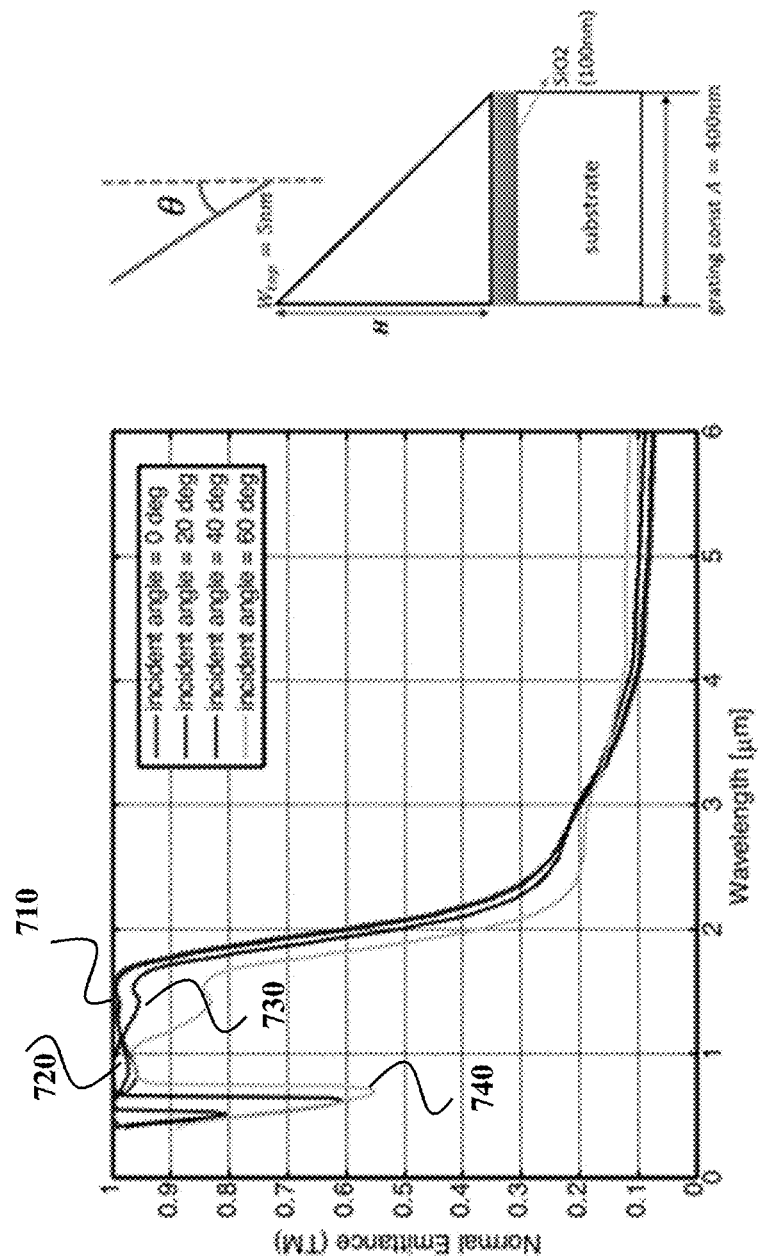
Figure 7C:
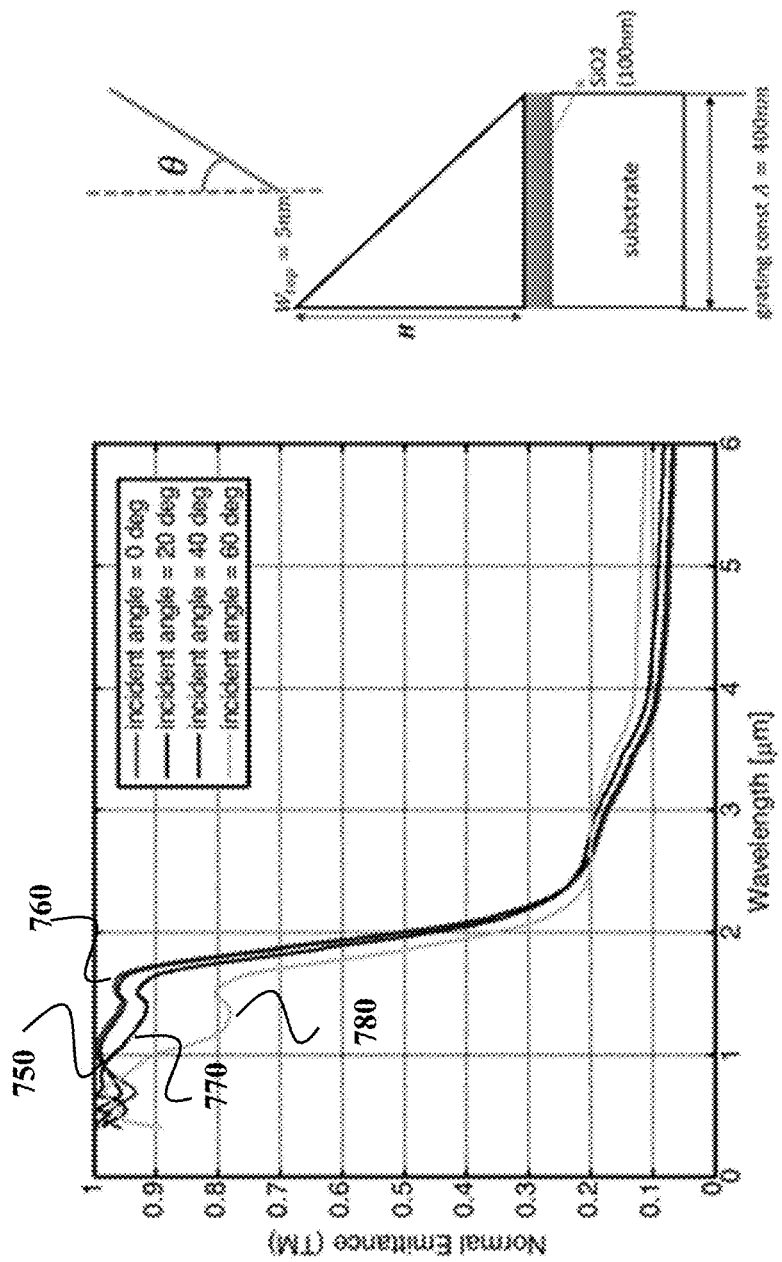

FIGS. 7A, 7B, and 7C are examples of different emittance plots for emittance of the thermal emitter of FIG. 3C. FIG. 7A shows the effect of grating height on the spectral normal emittance of the grating structure of the thermal emitter of FIG. 3C. For this asymmetric grating structure, unless the grating height is too large (e.g. more than 800 nm), the grating structure is suitable for the TPV system. Even at large grating height, the emittance at short wavelength (i.e. below 1.8 um), desired high emittance wavelength range for TPV emitter, is still very high. The normal emittance between 0.5-1.8 um is even higher than 0.95 in most wavelengths.

FIG. 7B shows the spectral emittance of grating structure C at different incident angles 710 0°, 720 20°, 730 40°, 740 60° (from left). When the incident angle (from the left side) is not greater than 40°, the emittance between 0.8 um and 1.8 um does not vary too much.

FIG. 7C shows the spectral emittance of the thermal emitter of FIG. 3C at different incident angles 750 0°, 760 20°, 770 40°, 780 60° (from right). When the incident angle (from the right side) is not greater than 40°, the emittance between 0.4 um and 1.8 um is higher than 0.9. For incident angle between 0 to 20°, the average emittance between 0.4 and 1.7 um is above 0.95. Even when the incident angle increases to 60°, the average emittance 780 between 0.4 um and 1.6 um is still above 0.8.

Figure 8A:
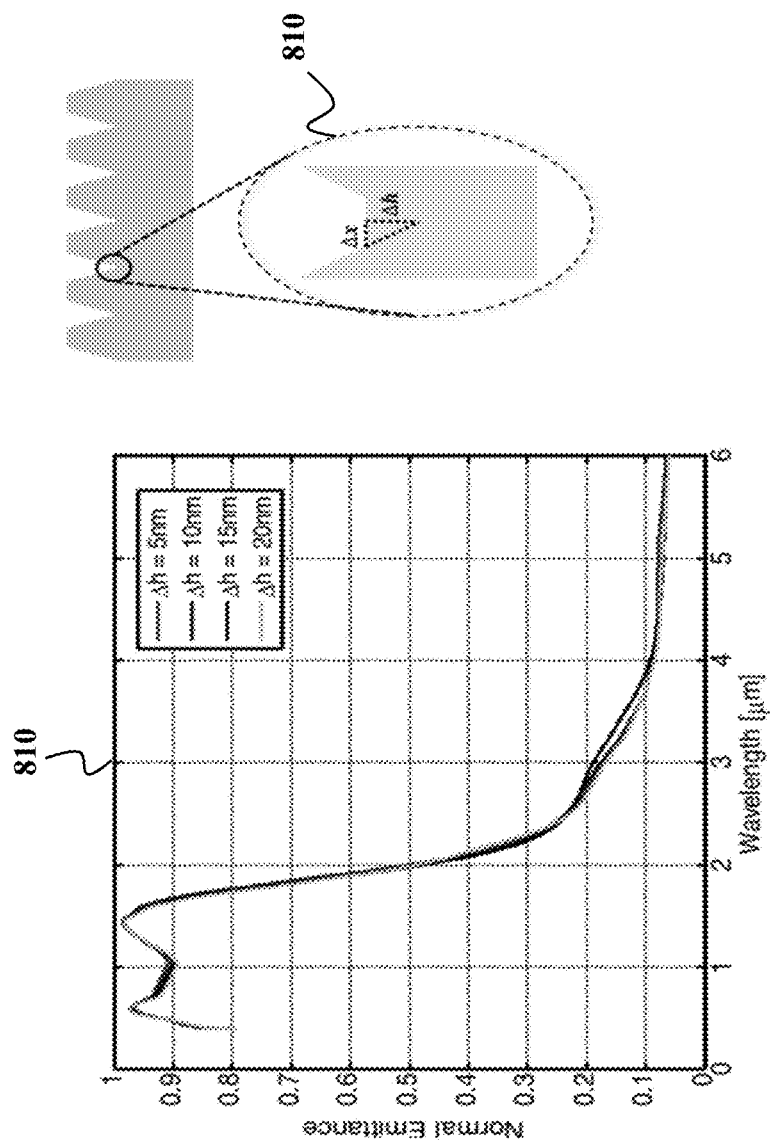
FIGS. 8A, 8B, and 8C are plots illustrating effect of a fabrication error on emittance of the thermal emitter designed using principles of some embodiments.
Figure 8B:
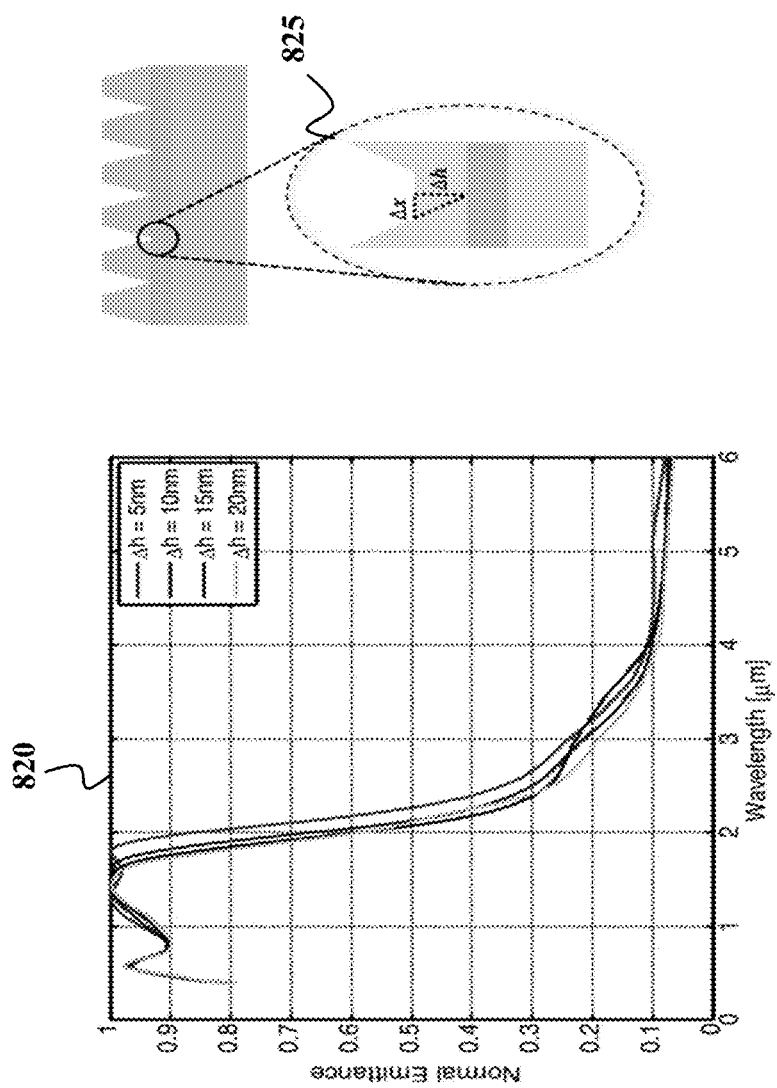
Figure 8C:
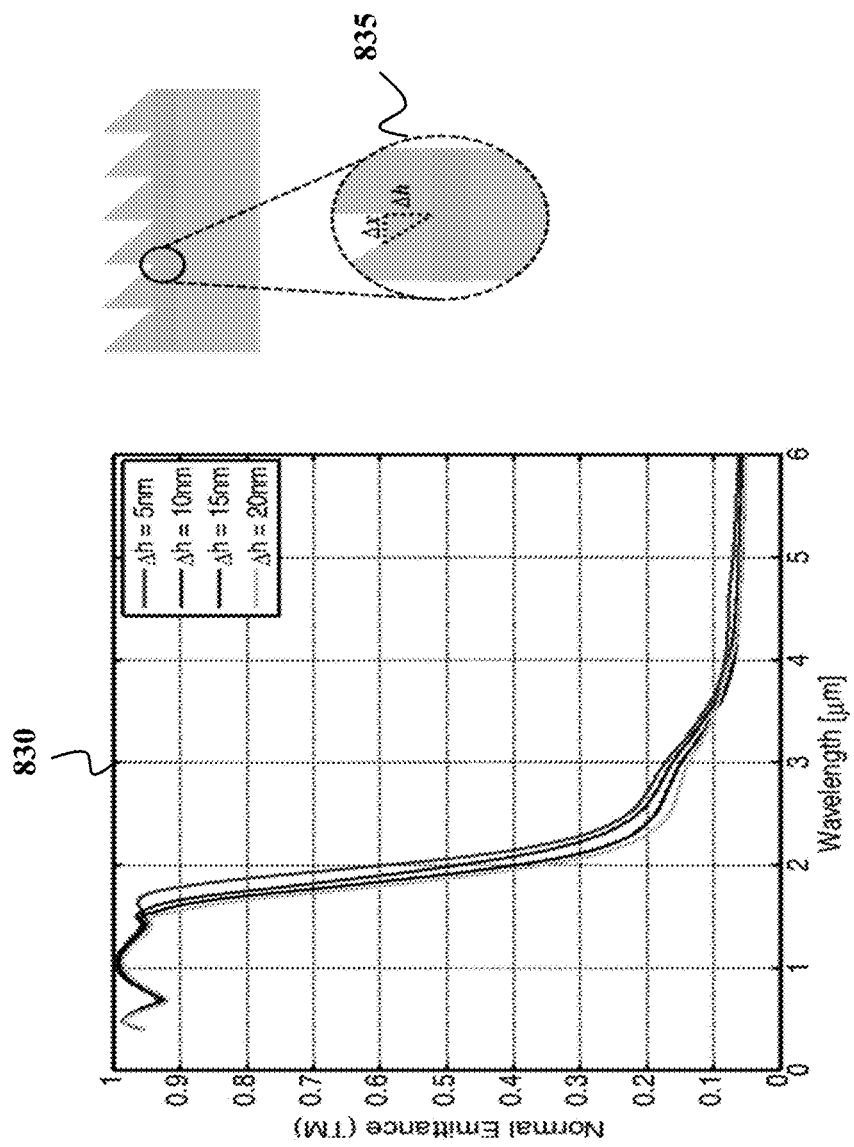

FIGS. 8A, 8B, and 8C show plots illustrating effect of a fabrication error on emittance of the thermal emitter designed using principles of some embodiments. Specifically, FIG. 8A shows an effect of fabrication error 815 on emittance 810 for the thermal emitter of FIG. 2A. FIG. 8B shows an effect of fabrication error 825 on emittance 820 for the thermal emitter of FIG. 3A. FIG. 8C shows an effect of fabrication error 835 on emittance 830 for the thermal emitter of FIG. 3C.

As shown, an introduction of small fabrication error does not affect the emittance performance too much, especially for the thermal emitter of FIG. 2A. For the thermal emitters of FIGS. 3A and 3B, as long as the fabrication error Δh is much small than the skin depth of the metal W, the shift of the emittance curve is small and the thermal emitters still can be used for TPV applications.

The above-described embodiments of the present invention can be implemented in any of numerous ways. For example, the embodiments may be implemented using hardware, software or a combination thereof. When implemented in software, the software code can be executed on any suitable processor or collection of processors, whether provided in a single computer or distributed among multiple computers. Such processors may be implemented as integrated circuits, with one or more processors in an integrated circuit component. Though, a processor may be implemented using circuitry in any suitable format.

Although the disclosure has been described by way of examples and embodiments, it is to be understood that various other adaptations and modifications can be made within the spirit and scope of the invention. Therefore, it is the object of the appended claims to cover all such variations and modifications as come within the true spirit and scope of the invention.

We claim:

1. A thermophotovoltaic (TPV) system for converting heat into electricity, the TPV system includes a thermal emitter and a photovoltaic cell arranged in proximity to each other, wherein the thermal emitter is configured to absorb the heat to emit photons of radiation toward the photovoltaic cell which is configured to convert energy of the emitted photons into the electricity, wherein the thermal emitter, comprising:
    a substrate;
    a grating arranged atop the substrate, such that the grating forms an emitting surface of the thermal emitter oriented toward the photovoltaic cell, the grating includes a plurality of equidistant structures each having a cross-section with a trapezoid shape, wherein material of the substrate and material of the grating include refractory metal to convert the heat incoming to a surface of the thermal emitter opposite to the emitting surface into the radiation, wherein the refractory metal in the material of the substrate is the same or different from the refractory metal in the material of the grating; and
    a dielectric layer arranged between the grating and the substrate.

2. The TPV system of claim 1, wherein the material of the substrate, the material of the grating, or both includes tungsten.

3. The TPV system of claim 1, wherein the dielectric layer includes silicon dioxide.

4. The TPV system of claim 1, wherein geometric parameters of the grating are selected to excite multiple gap plasmon modes.

5. The TPV system of claim 4, wherein the geometric parameters include one or combination of periodicity of the grating, height of the grating, and dimensions of the trapezoid shape.

6. The TPV system of claim 1, wherein the trapezoid shape has two parallel sides including a bottom side proximate to the substrate and a top side opposite to the bottom side, wherein the width of the bottom side is greater than the width of the upper side.

7. The TPV system of claim 6, wherein the width of the bottom side is at least ten times greater than the width of the top side.

8. The TPV system of claim 1, wherein the trapezoid shape forms a right trapezoid.

9. The TPV system of claim 1, wherein the equidistant structures in the grating are separated by grooves of triangular profile.

10. The TPV system of claim 1, wherein the equidistant structures in the grating are separated by grooves, wherein the grooves have a trapezoid profile with two parallel sides including a bottom side proximate to the substrate and an upper side opposite to the bottom side, wherein the width of the bottom side is less than the width of the upper side.

11. The TPV system of claim 1, wherein geometrical parameters and the material of the thermal emitter are selected to emit the radiation having wavelengths shorter than $\lambda g$ determined according to $\lambda_g = hc/E_g$, where h is the Planck constant, c is the speed of light, and $E_g$ is bandgap energy of the photovoltaic cell.

12. A method for manufacturing a thermophotovoltaic (TPV) system for converting heat into electricity, the TPV system includes a thermal emitter and a photovoltaic cell arranged in proximity to each other, wherein the thermal emitter is configured to absorb the heat to emit photons of radiation toward the photovoltaic cell configured to convert energy of the emitted photons into the electricity, comprising:
    selecting a material of the thermal emitter including at least one refractory metal that converts incoming heat into radiation;
    selecting geometrical parameters of a trapezoid shape based on a function of a bandgap of the photovoltaic cell, wherein the geometrical parameters and the material of the thermal emitter are selected to emit the radiation having wavelengths shorter than $\lambda g$ determined according to $\lambda_g = hc/E_g$, where h is the Planck constant, c is the speed of light, and $E_g$ is bandgap energy of the photovoltaic cell; and
    manufacturing, from the material, the thermal emitter having a substrate and a grating including a plurality of equidistant structures each with the shape having a non-rectangular cross-section forming the trapezoid shape with the geometrical parameters, and wherein a dielectric layer is arranged between the grating and the substrate; and
    arranging the photovoltaic cell in proximity to the thermal emitter such that the grating forms an emitting surface of the thermal emitter oriented toward the photovoltaic cell.

* * * * *